United States Patent
Leong et al.

(10) Patent No.: US 12,284,924 B2
(45) Date of Patent: Apr. 22, 2025

(54) PROGRAMMABLE INTERPOSER USING RRAM PLATFORM

(71) Applicant: GLOBALFOUNDRIES Singapore Pte. Ltd., Singapore (SG)

(72) Inventors: Lup San Leong, Singapore (SG); Juan Boon Tan, Singapore (SG); Benfu Lin, Singapore (SG); Yi Jiang, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 644 days.

(21) Appl. No.: 17/697,974

(22) Filed: Mar. 18, 2022

(65) Prior Publication Data

US 2023/0301214 A1    Sep. 21, 2023

(51) Int. Cl.
*H10N 70/00* (2023.01)
*H10B 63/00* (2023.01)

(52) U.S. Cl.
CPC .......... *H10N 70/826* (2023.02); *H10B 63/00* (2023.02); *H10N 70/021* (2023.02); *H10N 70/8833* (2023.02)

(58) Field of Classification Search
CPC .............................. H10N 70/00; H10B 63/00
See application file for complete search history.

(56) References Cited

U.S. PATENT DOCUMENTS

| 8,476,735 | B2 | 7/2013 | Hsu et al. |
| 9,502,469 | B2 | 11/2016 | Lu et al. |
| 2010/0182040 | A1 | 7/2010 | Feng et al. |

OTHER PUBLICATIONS

Sacchetto et al., "Resistive Programmable Through-Silicon Vias for Reconfigurable 3-D Fabrics", IEEE Transactions on Nanotechnology, 2012, 5 pages, vol. 11, Issue 1, IEEE.

*Primary Examiner* — Marvin Payen
(74) *Attorney, Agent, or Firm* — VIERING JENTSCHURA & PARTNER MBB

(57) ABSTRACT

According to various embodiments, there may be provided an interposer. The interposer including: a substrate; a dielectric layer disposed on the substrate; a via disposed entirely within the dielectric layer; a resistive film layer disposed to line the via; a metal interconnect disposed in the resistive layer lined via; and a plurality of metal lines disposed in the dielectric layer, the plurality of metal lines including a first metal line connected to the metal interconnect, a second metal line connected to the resistive film layer at a first point, and a third metal line connected to the resistive film layer at a second point.

20 Claims, 12 Drawing Sheets

PROGRAMMABLE INTERPOSER USING RRAM PLATFORM

TECHNICAL FIELD

Various embodiments relate to an interposer, and a method of forming the interposer.

BACKGROUND

An interposer may provide an intermediate level of interconnect between multiple dies within a package and/or between one or more dies and the external connectors of the packaging. An interposer may include a silicon layer with through-silicon vias (TSVs) and an organic redistribution layer (RDL). That is, an interposer may function similarly to a printed circuit board (PCB) except that it is provided as a structure within the packaging.

Some interposers may provide a switching element to provide switching or rerouting capabilities. For example, some interposers may include a TSV with a resistive switching layer in the silicon. However, the fabrication of the resistive switching layer in the TSV may be lead to localized plasma damage to the resistive switching layer caused by reactive-ion etching (RIE) during a patterning process.

SUMMARY

According to various embodiments, there may be provided an interposer. The interposer may include a substrate. The interposer may include a dielectric layer disposed on the substrate. The interposer may include a via disposed entirely within the dielectric layer. The interposer may include a resistive film layer disposed to line the via. The interposer may include a metal interconnect disposed in the resistive layer lined via. The interposer may include a plurality of metal lines disposed in the dielectric layer, the plurality of metal lines including a first metal line connected to the metal interconnect, a second metal line connected to the resistive film layer at a first point, and a third metal line connected to the resistive film layer at a second point.

According to various embodiments, the via may include a first end and a second end opposite the first end and sides extending vertically from the first end to the second end, wherein the resistive film layer may line the sides and the first end of the via, the resistive film layer may include a first side portion, a second side portion, and a first end portion, the second side portion opposite the first side portion, wherein the metal interconnect includes a first end and a second end opposite the first end, the first end of the metal interconnect facing the substrate is entirely surrounded by the resistive film layer and the second end of the metal interconnect is in direct contact with the dielectric layer, and wherein the first metal line is directly connected to the metal interconnect, the second metal line is directly connected an outer surface of the resistive film layer at the first point, and the third metal line directly connected to the outer surface of the resistive film layer at the second point.

According to various embodiments, there may be provided a method of forming the interposer. The method may include: providing a substrate; providing a dielectric layer disposed on the substrate; providing a via disposed entirely within the dielectric layer; providing a resistive film layer disposed to line the via; providing a metal interconnect disposed in the resistive layer lined via; and providing a plurality of metal lines disposed in the dielectric layer, the plurality of metal lines including a first metal line connected to the metal interconnect, a second metal line connected to the resistive film layer at a first point, and a third metal line connected to the resistive film layer at a second point.

Additional features for advantageous embodiments are provided in the dependent claims.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DESCRIPTION

Figure 1A:
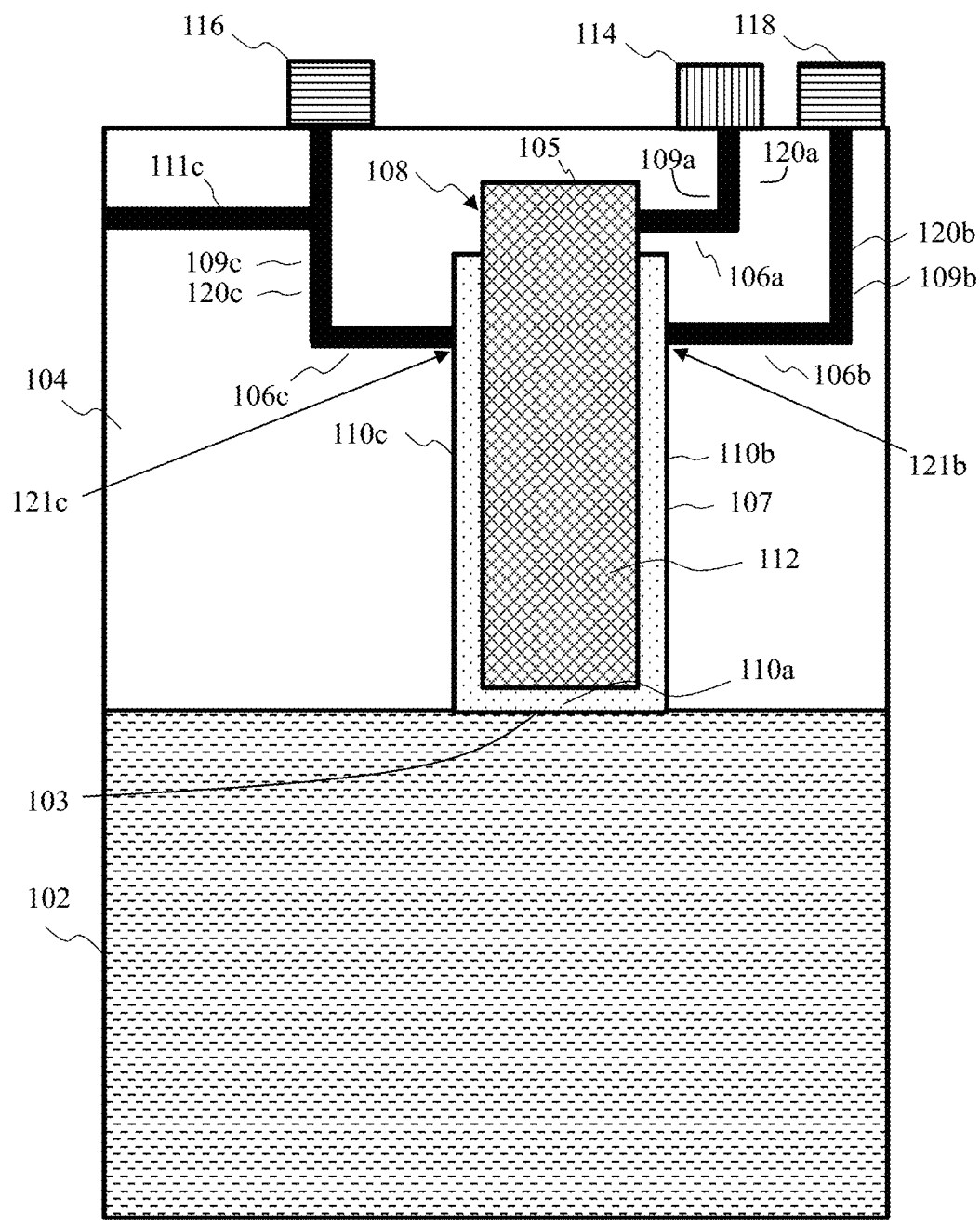
FIG. 1A shows a cross-sectional view of an interposer 100 according to various non-limiting embodiments.

The embodiments generally relate to an interposer. More particularly, various embodiments relate to an interposer having a vertically disposed structure operable as a resistive random-access memory (RRAM), which configures the interposer to be a programmable interposer capable of selectively transmitting an electrical signal to at least one chip electrically coupled to the vertically disposed structure. A RRAM may operate by changing the resistance of a solid dielectric material. Existing methods for integrating RRAM into an interposer have the RRAM configured as a horizontally disposed planar structure, wherein the horizontally disposed planar structure has a switching layer disposed horizontally in the way of a conductive path in the interposer. Such a switching layer transmits or blocks electrical signals to all chips, i.e. not selectively. Conversely, the RRAM in the interposer of the present disclosure is vertically disposed, that is to say, the switching layer of the present interposer is also vertically disposed. In non-limiting embodiments, the RRAM may be configured as an inter-tier via.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "approximately", "about," is not limited to the precise value specified. In some instances, the approximating language may correspond to the precision of an instrument for measuring the value. Further, a direction is modified by a term or terms, such as "substantially" to mean that the direction is to be applied within normal tolerances of the semiconductor industry. For example, "substantially parallel" means largely extending in the same direction within normal tolerances of the semiconductor industry and "substantially perpendicular" means at an angle of ninety degrees plus or minus a normal tolerance of the semiconductor industry.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while considering that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

FIG. 1A shows a cross-sectional view of an interposer 100 according to various non-limiting embodiments. As shown in FIG. 1A, the interposer 100 may include a substrate 102, a dielectric layer 104 disposed on the substrate 102, an inter-tier via 108 disposed entirely within the dielectric layer 104, and a plurality of metal redistribution lines 120 within the dielectric layer 104 and extending from the inter-tier via 108. The inter-tier via 108 may have a first end 103 and a second end 105 opposite the first end 103 and sides 107 extending vertically between the first end 103 and the second end 105. The first end 103 may face the substrate 102. The first end 103 may further include an opening in the dielectric layer 104 and may expose a portion of the substrate 102. The inter-tier via 108 may include a resistive film lining 110 having portions 110b and 110c lining the sides 107 of the inter-tier via 108 and a portion 110a lining the first end 103 of the inter-tier via 108. The portion 110a of the resistive film lining 110 may be in direct contact with the substrate 102. The inter-tier via 108 may further include a metal interconnect 112 extending vertically from the first end 103 to the second end 105. The metal interconnect 112 at the first end 103 may be entirely embedded within the resistive film lining 110. The metal interconnect 112 at the second end 105 may extend beyond the portions 110b and 110c of the resistive film lining 110 and may be directly in contact with the dielectric layer 104. The inter-tier via 108 may be substantially cylindrical.

The dielectric layer 104 may include the plurality of metal redistribution lines 120. Each of the metal redistribution lines 120 may include a horizontal portion 106 and a vertical portion 109. A first metal redistribution line 120a may extend from the metal interconnect 112. The first metal redistribution line 120a may include a horizontal portion 106a (e.g., line segment) and a vertical portion 109a (e.g., a via). The first metal redistribution line 120a may be directly connected to the metal interconnect 112. The first metal redistribution line 120a may be configured to connect to a memory controller 114 or a PN junction embedded within the interposer 100. A second metal redistribution line 120b may extend from a first point 121b of the resistive film lining 110. A third metal redistribution line 120c may extend from a second point 121c of the resistive film lining 110. The second and third metal redistribution lines 120b and 120c may be directly connected to points 121b and 121c of the resistive film lining 110, respectively. In various embodiments, the points 121b and 121c may be opposite each other on opposing sides of the resistive film lining 110.

In various embodiments, the second metal redistribution line 120b may include a horizontal portion 106b (e.g., line segment) and a vertical portion 109b (e.g. via segment) and the third metal redistribution line 120c may include a horizontal portion 106c (e.g., line segment) and a vertical portion 109c (e.g., via segment). The horizontal portions 106b and 106c may be formed in a same metal layer of the redistribution layer. In other various embodiments, the horizontal portions 106b and 106c may be formed in different metal layers of the redistribution layer.

In various embodiments, the metal redistribution lines (e.g., vertical portions and horizontal portions) may have a cross-sectional diameter or thickness from about 100 nm to about 200 nm.

In various embodiments, the substrate 102 may include silicon substrate. The substrate 102 may also be a silicon germanium, germanium, gallium arsenide, or crystal-on-insulator (COI) such as silicon-on-insulator (SOI) substrate.

In various embodiments, the dielectric layer 104 may include silicon nitride or silicon dioxide. In various embodiments, the dielectric layer 104 may include silicon dioxide with tetraethyl orthosilicate, silicon nitride, thermal oxide, or any low-K dielectric material. In various embodiments, the dielectric layer 104 may be a redistribution layer.

In various embodiments, the metal interconnect 112 may include copper, platinum, ruthenium, or tantalum nitride.

Referring to FIG. 1A, it is shown that the inter-tier via 108 is disposed in the dielectric layer 104. The via 108 may have a critical dimension of 50 nm to 200 nm. The critical dimension refers to the distance between the two opposing vertical surfaces of the via 108. In various embodiments, the two opposing vertical surfaces of the via 108 may be spaced apart at a distance of 50 nm to 200 nm, 50 nm to 100 nm, 50 nm to 150 nm, 100 nm to 200 nm, 150 nm to 200 nm, 100 to 150 nm, etc. In certain non-limiting embodiments, the via 108 may have a vertically disposed cylindrical configuration. In such embodiments, the critical dimension refers to the cross-sectional diameter of the via 108. The diameter may be 50 nm to 200 nm, 50 nm to 100 nm, 50 nm to 150 nm, 100 nm to 200 nm, 150 nm to 200 nm, 100 to 150 nm, etc. A cylindrical via disposed in the dielectric layer 104, nevertheless, can be understood to have two opposing vertical surfaces.

In various embodiments, as shown in FIG. 1A, the metal interconnect 112 may be disposed in the resistive film lining 110 and surrounded on three sides by the resistive film lining portions 110a, 110b, 110c (e.g., a horizontal base portion, a first vertical side portion, and a second vertical side portion opposite the first side when viewed as a cross-section of the inter-tier via cut along a diameter of the inter-tier via). The metal interconnect 112 may be disposed to contact the portions 110a, 110b, 110c. The metal interconnect 112 may be in direct contact with the inner surface of the resistive film lining 110 at portions 110a, 110b, and 110c. The resistive film lining 110 may include an opening at the second end 105 of the via 108 between the vertically arranged resistive lined portions 110b, 110c. The opening being opposite the resistive lined portion 110a. The metal interconnect 112 may extend above the opening and over the resistive layer 110b, 110c. The metal interconnect 112 may have a surface in contact with the dielectric layer 104 above the opening formed by the resistive lined surfaces.

In various embodiments, the resistive film layer 110, 110a, 110b, 110c may include hafnium oxide, tantalum oxide, or titanium oxide. The resistive layer 110a, 110b, 110c may be a continuous layer.

In various embodiments, the resistive film layer may have a thickness from about 5 nm to about 30 nm.

Figure 3A:
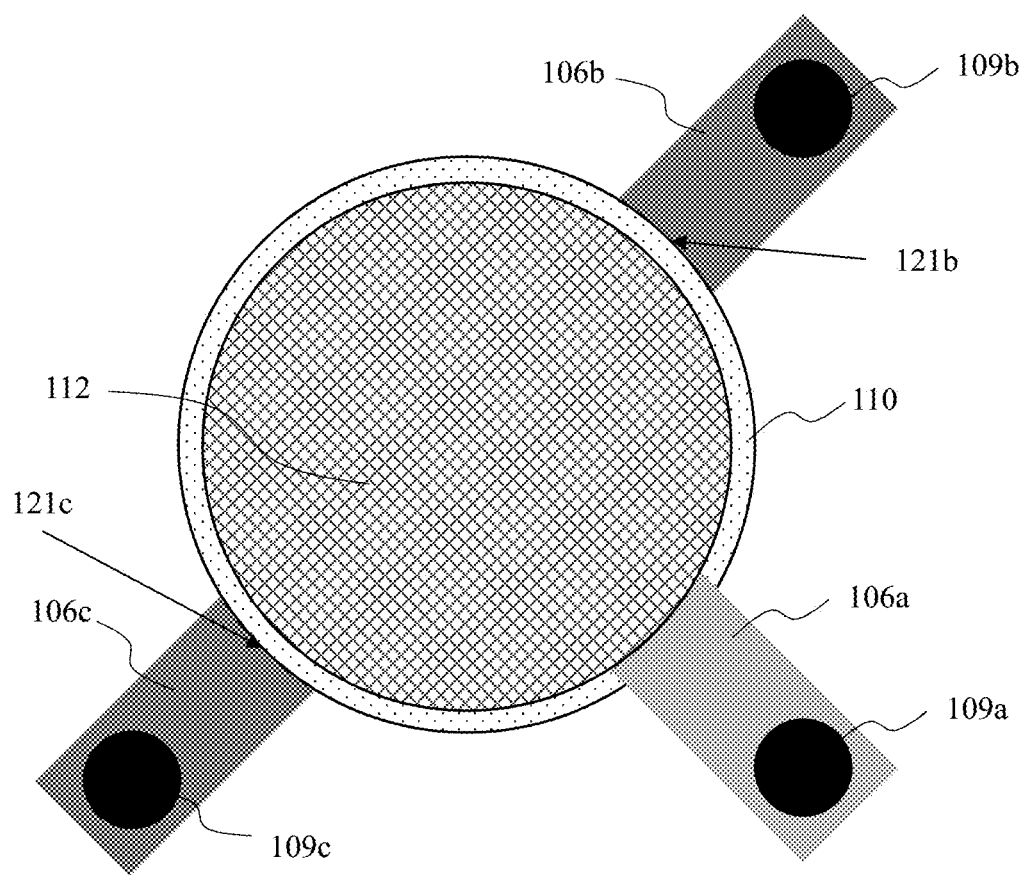
FIG. 3A shows a top plan view indicating various interconnections in an RDL of interposer 100 according to various non-limiting embodiments.

FIG. 3A shows a top plan view indicating various interconnections in an RDL of interposer 100 according to various non-limiting embodiments. As shown in FIG. 3A, the resistive film lining 110 wraps around the metal interconnect 112. The line segment (horizontal portion) 106a of a first redistribution line 120a may be directly connected to the metal interconnect 112. The line segment (horizontal portion) 106b of a second redistribution line 120b may be directly connected to the resistive film lining at a first point 121b on an outer surface of the resistive film lining. The line segment (horizontal portion) 106c of a third redistribution line 120c may be directly connected to the resistive film lining at a second point 121c on an outer surface of the resistive film lining. The line segment 106a of the first redistribution line 120a may be formed in a first metal layer. The line segment 106b of the redistribution line 120b and line segment 106c of the redistribution line 120c may be formed in a second metal layer. In some embodiments, the first point 121b and second point 121c may be opposite each other. The first and second metal layers may be different layers. In various other embodiments, the line segment 106b and line segment 106c may be formed in different metal layers. That is, each of the line segments 106a, 106b, and 106c may be formed in a metal layer at a different depth in the RDL.

The via 109a (vertical portion) of the first redistribution line 120a may connect the line segment 106a (horizontal portion) of the first redistribution line 120a to a first chip 114. The via 109b (vertical portion) of the second redistribution line 120b may connect the line segment 106b (horizontal portion) of the second redistribution line 120b to a second chip 118. The via 109c (vertical portion) of the third redistribution line 120c may connect the line segment 106c (horizontal portion) of the third redistribution line 120c to a third chip 116. In various embodiments, a redistribution line 120 may include one or more line segments (e.g., horizontal portions) 106 and one or more via segments (e.g., vertical portions) 109. For example, another component (e.g., a through silicon via) may also be connected to the inter-tier via 108 through one of the redistribution lines. For example, referring to the non-limiting example of FIG. 1A, the redistribution line 120c may include another line segment (horizontal portion) 111c connected to the via segment 109c.

The inter-tier via 108 may be operable as a memory switch. For example, it may be configured as an RRAM. In various embodiments, the metal layer may include redistribution lines 120a, 120b, 120c, which electrically connects the RRAM to various chips 114, 116, 118. The term "redistribution lines" is referred herein interchangeably as metal lines and vias and redistribution layers. In various embodiments, the metal layer may be electrically connected to the metal of the metal interconnect 112 to a control chip 114. Said differently, the metal layer may include a metal line 120a that electrically connects the metal interconnect 112 to the control chip 114. That is, a control chip 114 may be directly connected to the metal interconnect 112 of the inter-tier via 108 rather than indirectly connected through the resistive film lining 110. Before describing how the control chip operates, connection of the RRAM to other chips are first described. The chips 114, 116, 118 may be heterogeneously integrated on the interposer 100, with the interposer 100 as the base.

In various embodiments, as can be seen in FIG. 1A, the redistribution lines 120a, 120b, and 120c may be electrically connected to the inter-tier via 108 at different points. Each of the redistribution lines 120a, 120b, and 120c includes a metal segment 106a, 106b, and 106c and a metal via 109a, 109b, and 109c, respectively. A first redistribution line 120a may connect a first chip 114 (e.g., a control chip) to the inter-tier via 108. A second redistribution line 120b may connect a second chip 118 to the inter-tier via 108. A third redistribution line 120c may connect a third chip 116 to the inter-tier via 108. The first segment 106a may directly connect to the metal interconnect 112 (e.g., a control connection). The second segment 106b may directly connect to a first point 121b of the resistive film lining 110 (e.g., a switchable connection). The third segment 106c may directly connect to a second point 121c of the resistive film lining 110 different than the first point 121b (e.g., another switchable connection). The first and second points 121b, 121c may be on an outer surface of the resistive film lining 110. The first point 121b and second point 121c may be points on opposing vertical surfaces of the resistive film lining 110. For example, as shown in FIG. 1A, the second segment 106b may be electrically connected to a point 121b on portion 110b of the resistive film lining 100 which may be a first vertical portion of the resistive lining 110. The third segment 106c may be electrically connected to a point 121c on portion 110c of the resistive film lining 100 which may be a second vertical portion of the resistive lining 110.

Figure 4A:
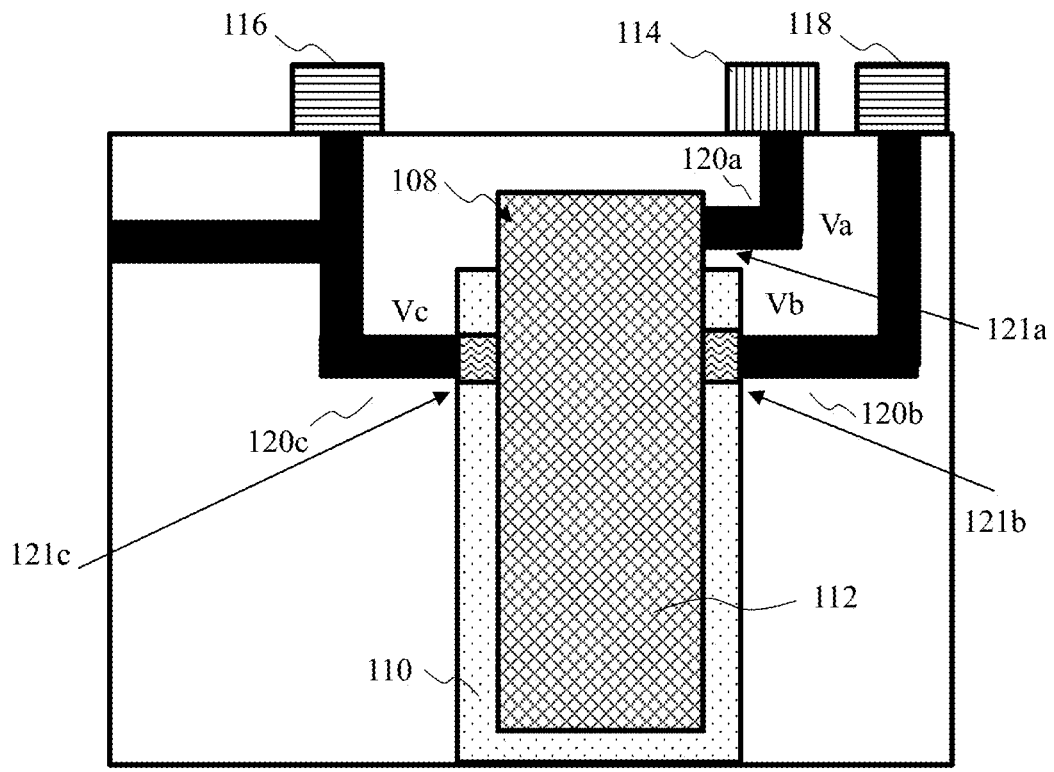
FIG. 4A shows an operative diagram illustrating the switch functionality of interposer 100 according to various non-limiting embodiments.

FIG. 4A shows an operative diagram illustrating the memory switch functionality of interposer 100 according to various non-limiting embodiments. In various embodiments, the first chip 114 may be a control chip 114 configured to enable or disable connections through the inter-tier via 108. Referring to FIG. 4A, each of the connections to the inter-tier via 108 may be associated with a voltage. For example, the redistribution line 120a of the control chip 114 may have a voltage Va, the redistribution line 120b of the second chip 118 may have a voltage Vb, the redistribution line 120c of the third chip 116 may have a voltage Vc. The resistive film lining 110 may form localized conductive filaments depending on a localized potential difference through the resistive film lining. That is, a localized portion of the resistive film lining may become conductive when a localized potential difference may be formed between a point on an outer surface of the resistive film lining and a point on an inner surface of the resistive film lining opposite the point on the outer surface and the potential difference exceeds a threshold. For example, the localized potential difference at point 121b is Vb-Va and the localized potential different at point 121c is Vc-Va. Vb and Vc may be different voltages. The control chip 114 may be operable to set a voltage Va and thereby adjust the localized potential difference at different points of the resistive film lining. For example, when the potential difference at point 121c is greater than a threshold voltage (Vc−Va>Vt) the resistive film lining becomes conductive at point 121c allowing redistribution line 120c to be in electrical contact with the metal interconnect 112. For example, when the potential difference at point 121b is greater than a threshold voltage (Vb−Va>Vt) the resistive film lining becomes conductive at point 121b allowing redistribution line 120b to be in electrical contact with the metal interconnect 112. The controller chip 114 may enable a connection to one of the second and third chips or enable a connection to both the second and third chips through the inter-tier via by controlling the voltage Va.

That is, the control chip 114 may be operable to provide a potential difference (e.g. a voltage) applied across the resistive layer at 121b such that only chip 118 receives an electrical signal when Vb−Va>Vt>Vc−Va. In another example, the control chip 114 may be operable to have a potential difference (e.g. a voltage) applied across the resistive layer at 121c such that only chip 116 receives an electrical signal when Vc−Va>Vt>Vb−Va. In another example, the control chip 114 may be operable to have a potential difference (e.g. a voltage) applied across the resistive layer at 121c and 121b such that both chips 116 and 118 receive an electrical signal when Vc−Va>Vb−Va>Vt. For example, FIG. 4A illustrates a case when localized conductive filaments may be formed at points 121b and 121c.

The threshold voltage across the resistive layer may depend, for example, by the type of material of the resistive layer and the geometry of the contact between the resistive layer and the interconnects (including, e.g., the thickness of the resistive layer and/or the area/shape of the connection).

Once a connection through a point in the resistive film lining is established, the connection remains until the potential difference at the point in the resistive film lining changes. In this manner, the controller chip 114 may configure different permanent switch connections based on a voltage applied to the metal interconnect 112.

Figure 2A:
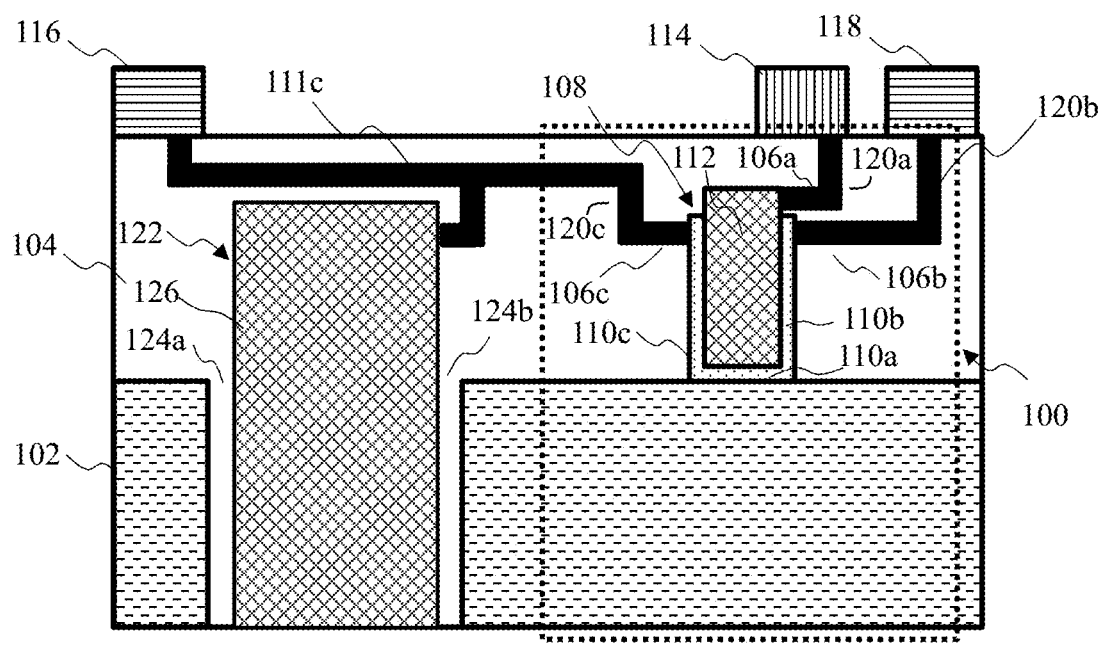
FIG. 2A shows a cross-sectional view of an interposer 100 connected to a TSV according to various non-limiting embodiments.

FIG. 2A shows a cross-sectional view of an interposer 100 connected to a TSV according to various non-limiting embodiments. In various embodiments, the interposer 100 may further include a through silicon via 122 which extends through the substrate 102 and into the dielectric layer (RDL) 104, wherein the through silicon via 122 includes a metal 126 disposed therein, and the metal 126 is in contact with one of the redistribution lines, e.g., 120c (e.g. see FIG. 2A). The portion of the through silicon via in substrate 102 may be lined with a dielectric material. This can be seen in FIG. 2A, wherein a dielectric material lines the surfaces 124a, 124b of the portion of the through silicon via 122 in the substrate 102. In certain non-limiting embodiments, the dielectric material may line the opposing surfaces 124a, 124b of the portion of the through silicon via 122 in the substrate 102. The dielectric material may be of the same material as the dielectric layer 104. The metal 126 may be of the same material as the metal interconnect 112 disposed in the via 108 of the RRAM structure. In various embodiments, the critical dimension of the through silicon via 122 is larger than the critical dimension of inter-tier via 108. For example, a cross-sectional diameter of the TSV 122 may be from about 5 μm to about 20 μm, whereas, a cross-sectional diameter of the inter-tier via 108 may be from about 50 nm to about 200 nm.

Figure 1B:
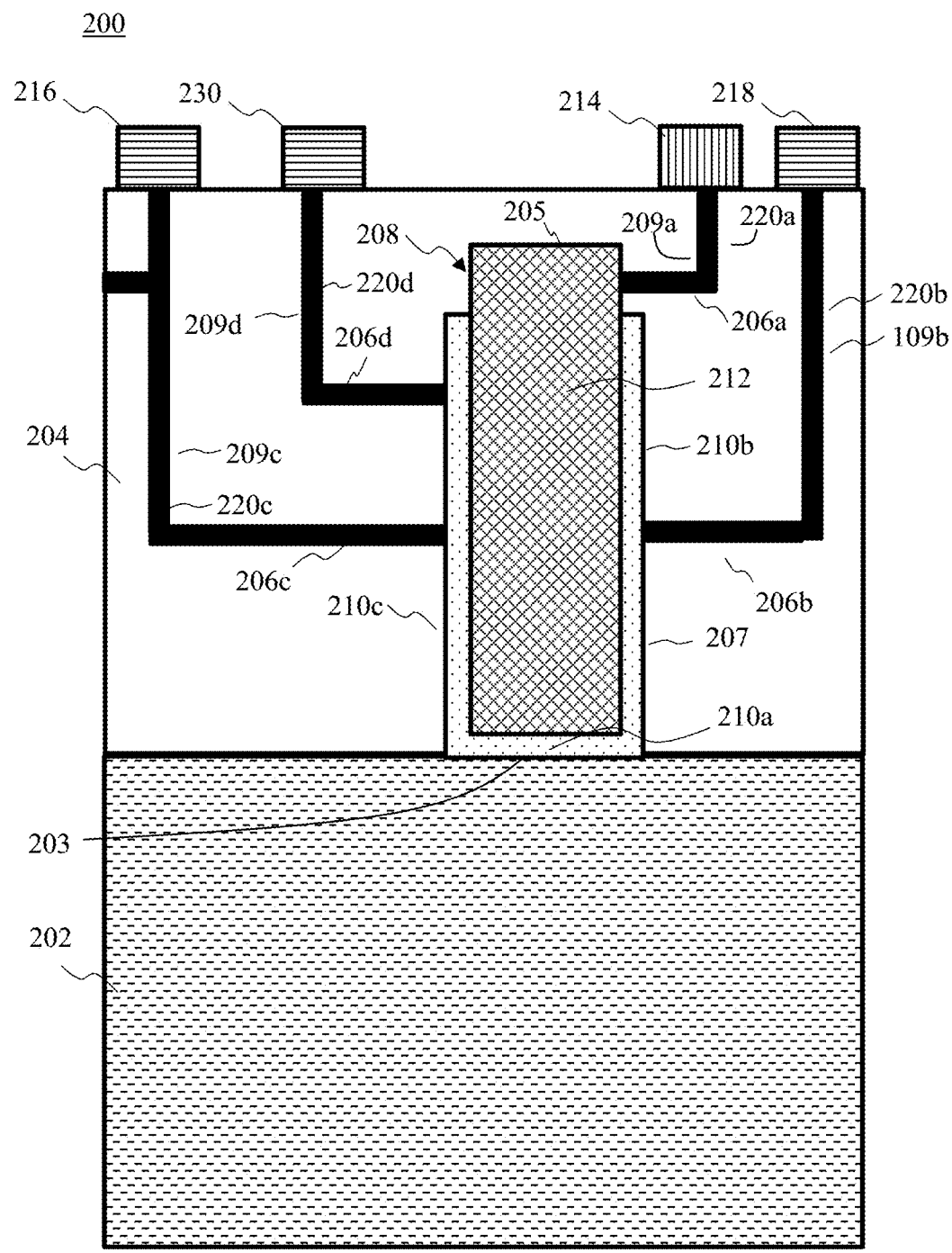
FIG. 1B shows a cross-sectional view of an interposer 200 according to various non-limiting embodiments.

FIG. 1B shows a cross-sectional view of an interposer 200 according to various non-limiting embodiments. Referring to FIG. 1B, the interposer 200 may be similar to the interposer 100 of FIG. 1A. The components of the interposer 200 that are similar to those in the interposer 100 are denoted with similar reference numerals, and a description thereof may be omitted. As shown in FIG. 1B, the interposer 200 may include a fourth chip 230 connected to the inter-tier via 208. The fourth chip 230 may be connected to the resistive lining 210 at a third point 221d on the resistive lining 210 by a fourth redistribution line 220d. The redistribution line 220d may include a horizontal portion 206d and a vertical portion 209d. As shown in FIG. 1B, the horizontal portion 206d of the fourth redistribution line 220d may be formed in a different metal layer than the other redistribution lines. In various other embodiments, the horizontal portions 206b, 206c, and 206d of the second, third, and fourth redistribution lines 220b, 220c, 220d may be formed in the same metal layer and connected to the resistive lining 210 at three different points.

Figure 3B:
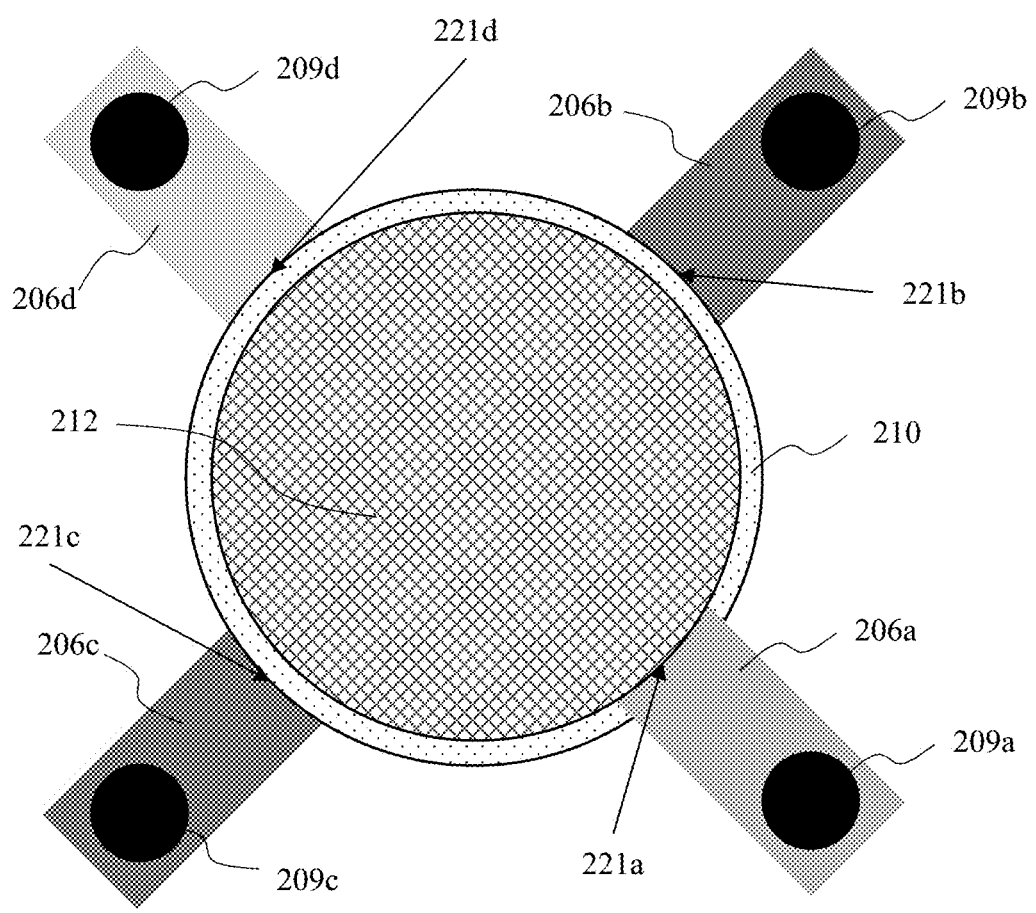
FIG. 3B shows a top plan view indicating various interconnections in an RDL of interposer 200 according to various non-limiting embodiments.

FIG. 3B shows a top plan view indicating various interconnections in an RDL of interposer 200 according to various non-limiting embodiments. The fourth chip 230 may be connected to the resistive lining 210 at a third point 221d on the resistive lining 210 by a fourth redistribution line 220d. Referring to FIG. 3B, the first redistribution line 220a may be connected to the metal interconnect 212 at point 221a. The second redistribution line 220b, the third redistribution line 220c, and the fourth redistribution line 220d may be connected to the resistive lining 210 at points 221b, 221c, and 221d respectively. The points 221b and 221c may be opposite each other and may be as the same or different heights. The points 221a and 221d may also be opposite each other but are at different heights. The heights of the points 221b, 221c, and 221d may be the same or different.

Figure 4B:
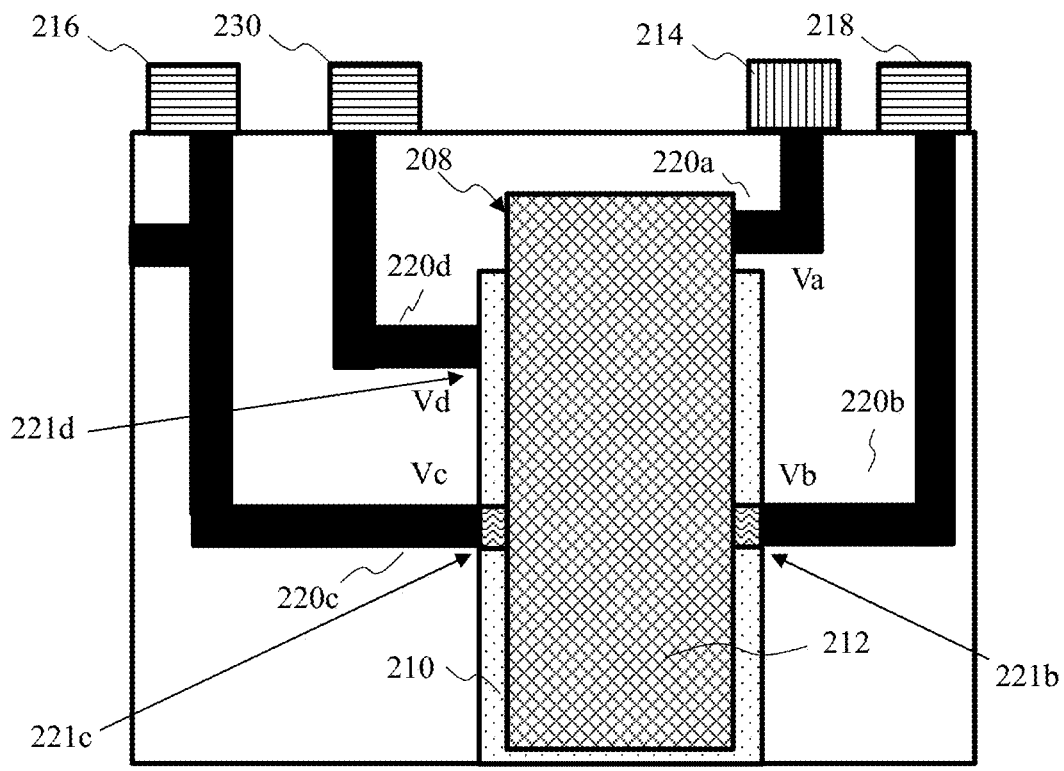
FIG. 4B shows an operative diagram illustrating the switch functionality of interposer 200 according to various non-limiting embodiments.

FIG. 4B shows an operative diagram illustrating the memory switch functionality of interposer 200 according to various non-limiting embodiments. In operation, the fourth chip 230 may have a potential Vd. For example, the control chip 214 may be operable to have a potential difference (e.g. a voltage) applied across the resistive layer at 121d such that only chip 230 receives an electrical signal when Vd−Va>Vt>Vb−Va or Vc−Va. In another example, the control chip 214 may be operable to have a potential difference (e.g. a voltage) applied across the resistive layer at 121c and 121b such that two chips 216 and 218 receive an electrical signal when Vc−Va>Vb−Va>Vt>Vd−Va. For example, FIG. 4B illustrates a case when localized conductive filaments may be formed at points 221b and 221c but not at point 221d.

Figure 2B:
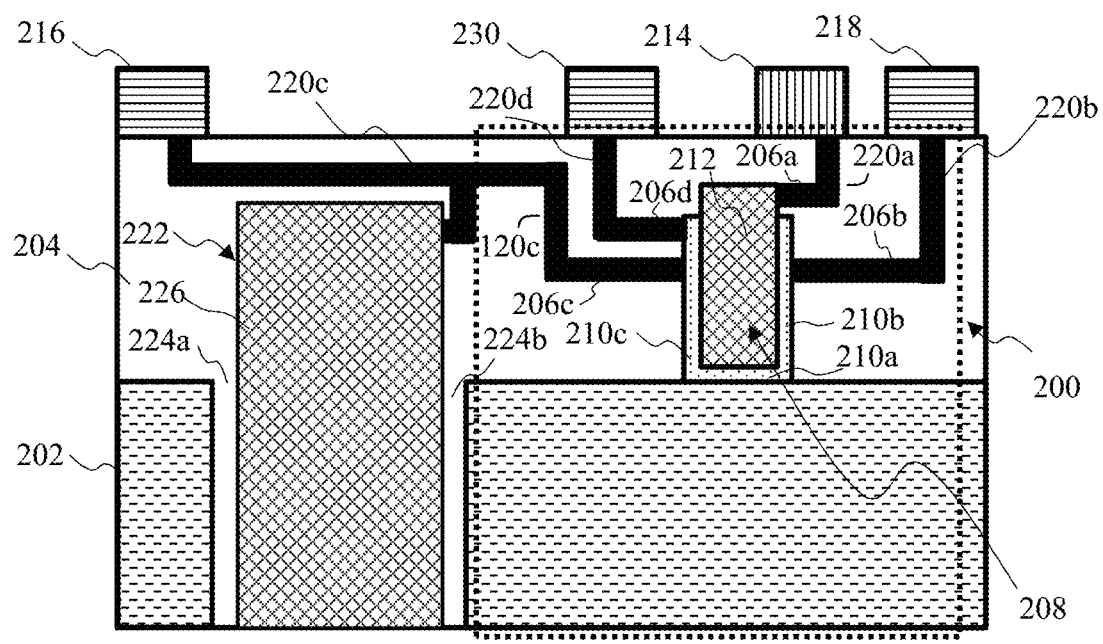
FIG. 2B shows a cross-sectional view of an interposer 200 connected to a TSV according to various non-limiting embodiments.

FIG. 2B shows a cross-sectional view of an interposer 200 connected to a TSV according to various non-limiting embodiments. The components of the interposer 200 that are similar to those in the interposer 100 are denoted with similar reference numerals, and a description thereof may be omitted.

Figure 1C:
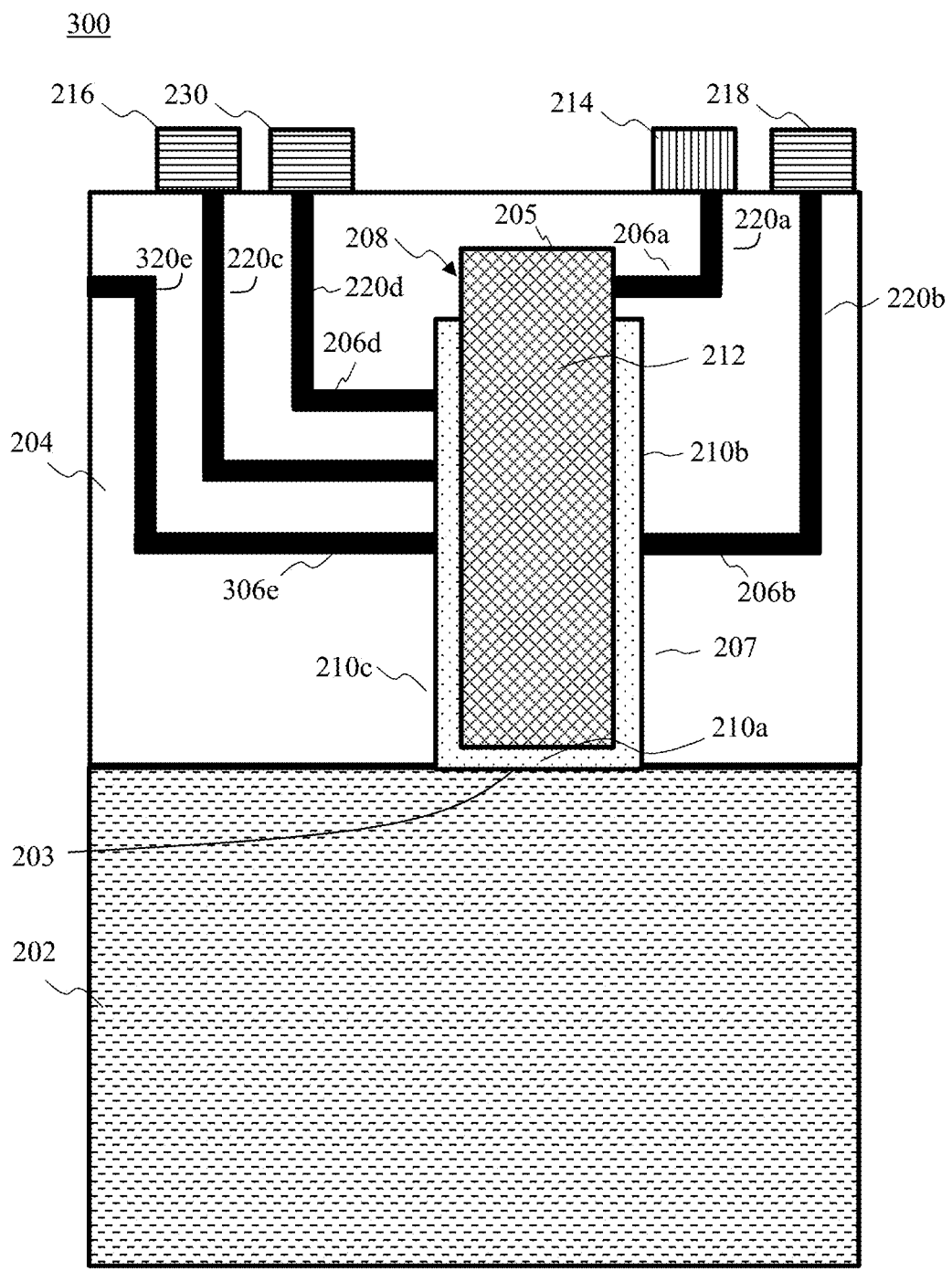
FIG. 1C shows a cross-sectional view of an interposer 300 according to various non-limiting embodiments.

FIG. 1C shows a cross-sectional view of an interposer 300 according to various non-limiting embodiments. Referring to FIG. 1C, the interposer 300 may be similar to the interposers 100 and 200 of FIGS. 1A and 2B. The components of the interposer 300 that are similar to those in the interposers 100 and 200 are denoted with similar reference numerals, and a description thereof may be omitted. As shown in FIG. 1C, the interposer 300 may include a fifth redistribution line 320e connected to the inter-tier via 208. The fifth redistribution line 320 may be connected to a TSV.

Various embodiments also relate to a method of forming the interposer 100 of the present disclosure. The method may be illustrated in further details, by way of non-limiting examples, as set forth in the drawings, particularly FIG. 5A to 5D.

Figure 5A:
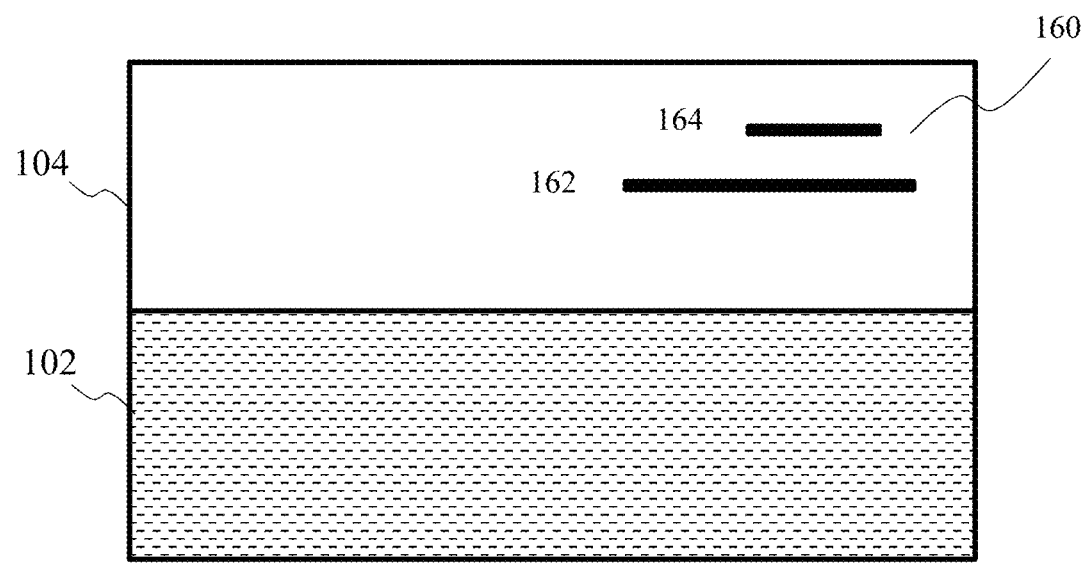
FIGS. 5A-5D illustrates for a method of forming the interposer 100.

FIG. 5A shows a cross-sectional view of a dielectric layer 104 formed on a substrate 102. A plurality of metal layers 160 are formed in the dielectric layer 104. For example, metal layers 162 and 164 may be formed in the dielectric layer 104.

Figure 5B:
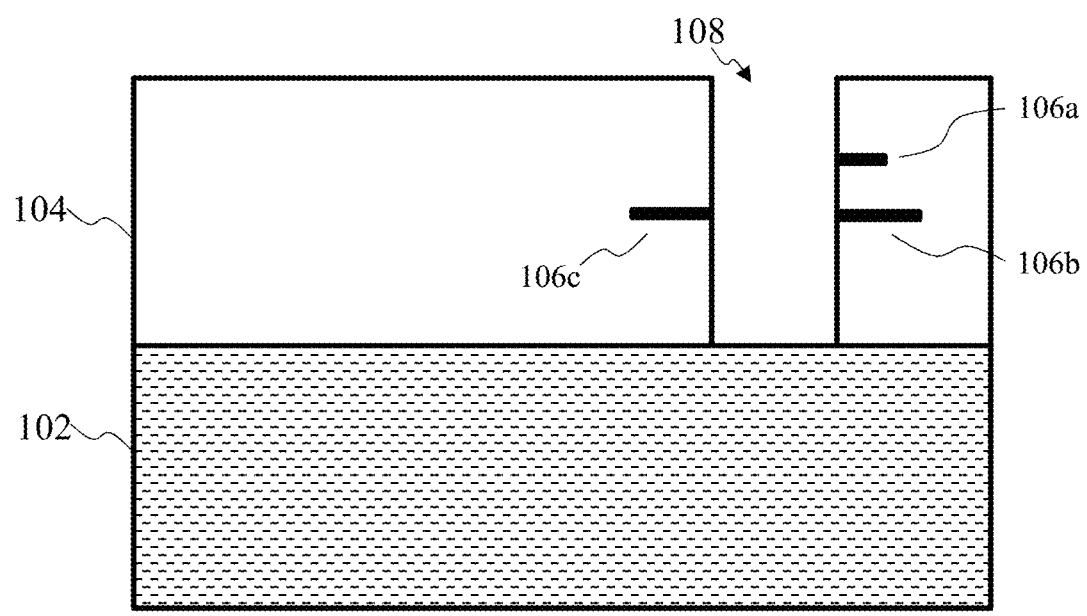

FIG. 5B illustrates for a method of forming the interposer 100. FIG. 5B shows a cross-sectional view of a via 108 formed in dielectric layer 104 through the metal layers 162 and 164, forming a segment 106a of a first redistribution line 220a, a segment 106b of a second redistribution line 220b and a segment 106c of a third redistribution line 220c in the metal layers. The via 108 has a first opening and a second opening. The first opening exposes the substrate 102.

Figure 5C:
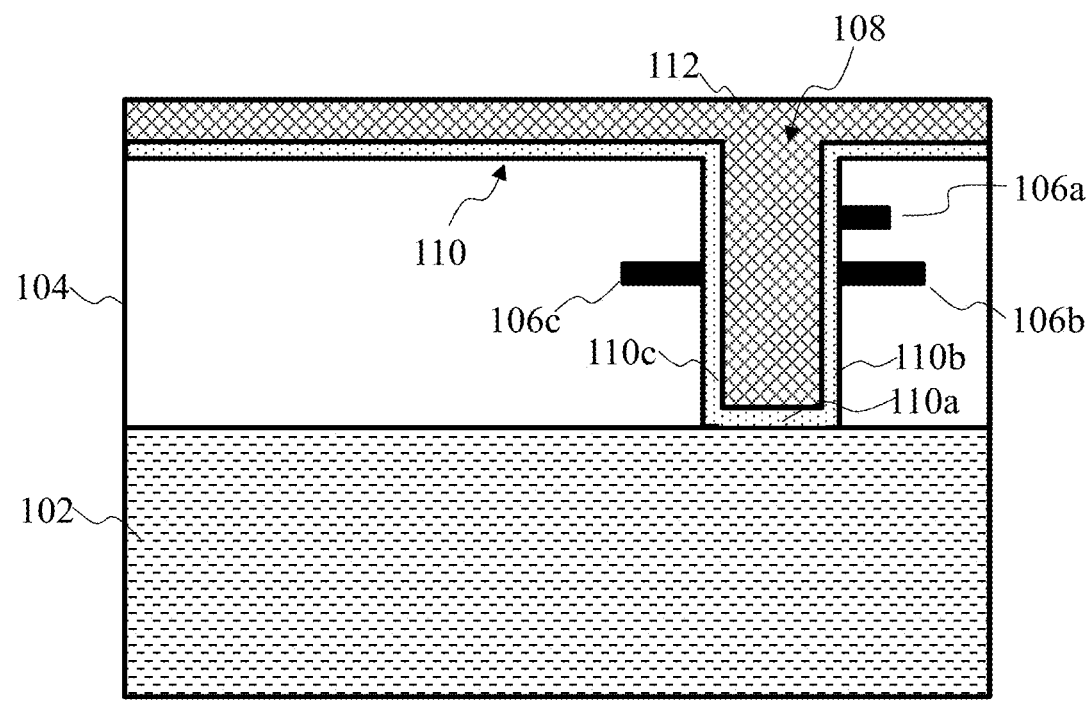

FIG. 5C illustrates for a method of forming the interposer 100. FIG. 5C shows a cross-sectional view of a resistive layer 110 formed on dielectric layer 104. The resistive layer portions 110a, 110b, 110c line the vertical surfaces of the via and the exposed substrate. A metal 112 is formed on the resistive layer 110. The metal 112 is also formed in the via 108.

Figure 5D:
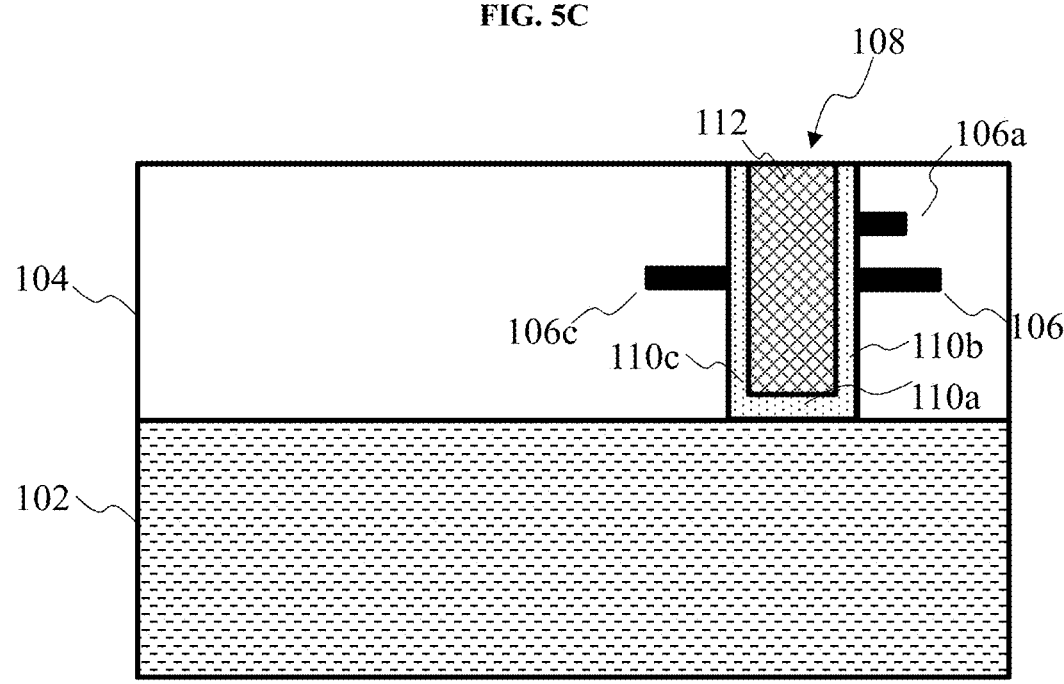

FIG. 5D illustrates for a method of forming the interposer 100. FIG. 5D shows a cross-sectional view of the metal 112 formed in the via 108. The resistive layer 110 and the metal 112 on the resistive layer 110 above the via are removed.

In various embodiments, the method (e.g. see FIGS. 5A to 5D) may include: providing a substrate 102, forming a dielectric layer 104 with metal layers 160 within the dielectric layer 104 over the substrate 102, the metal layers 160 having a first layer 162 and a second layer 164, forming a via 108 within the dielectric layer 104, the via 108 having a first opening disposed within the dielectric layer 104 and extends vertically through the metal layer 160 between the first and second layers 162 and 164 to a second opening disposed at a surface of the substrate 102 so as to expose the substrate 102, forming a resistive layer 110a, 110b, 110c (i) vertically along vertical surfaces of the via and (ii) on the exposed substrate 102 in the second opening of the via 108, and depositing a metal 112 in the via 108.

Starting with FIG. 5A, the dielectric layer 104 may be formed on the substrate 102 by any deposition method. The metal layer 162 may be formed by depositing a first portion of a dielectric material, then forming a masking layer on the first portion of the dielectric material deposited such that subsequently depositing a metal material leads to a metal layer 162 formed or confined to the position as shown in FIG. 5A. The masking layer and any unnecessary metal material are removed to give rise to metal layers 162. Additional metal layers, e.g., metal layer 164 may be similarly formed. The remaining portion of the dielectric material is then deposited thereon to complete the dielectric layer 104 having the metal layers 160 formed therein. The metal layers 160 may include copper or a RRAM compatible material, such as platinum. The metal layers 160 may constitute part of the electrical connection involving metal lines 120b, 120c that connects to other chips 116, 118.

Next, as shown in FIG. 5B, the via 108 may be formed by, for example, forming a photomask layer such that etching away the photomask layer gives rise to the via 108. The via 108 differs from traditional through silicon via as the via 108 is an "inter-tier" via. That is to say, the via 108 does not extend vertically across the entire depth of the interposer 100. The via 108 also does not extend into the substrate 102. The via 108 is formed within the dielectric layer 104. As such, the via 108 can be formed with a critical dimension of 50 nm to 200 nm, 50 nm to 100 nm, 50 nm to 150 nm, 100 nm to 200 nm, 150 nm to 200 nm, 100 to 150 nm, etc., whereas a traditional through silicon via may have a critical dimension of 5 μm to 20 μm in order to penetrate vertically across the substrate, or even across the entire depth of the interposer. Forming the via 108 may include removing a portion (e.g, etching through) of the metal layer 106 to form the first and second segments 106a, 106b.

Next, as shown in FIG. 5C, a resistive layer 110 may be deposited on the dielectric layer 104 and on the exposed surface of the substrate 102 in the via 108. A metal 112 is then deposited on the resistive layer 110, 110c and in the via 108. Removal of the metal and resistive layer above the via to retain the metal 112 and resistive layer 110 in the via 108 may be carried out as shown in FIG. 5D. For example, chemical mechanical polishing may be carried out to remove unnecessary resistive layer and metal so as to have only the metal 112 and resistive layer 110 formed in the via 108.

In various embodiments, the method may further include forming the metal layer in the dielectric layer 104 to electrically connect the metal 112 to a control chip 114 (e.g. see FIG. 1). This may include forming the metal lines 120a to establish an electrical connection between control chip 114 and the metal 112 of the RRAM structure. This may also include forming the metal lines 120b, 120c for electrical connection to other chips, 116, 118.

In various embodiments, the method may further include forming the segments 106a, 106b, 106c and vias 109a, 109b, 109c to electrically connect the inter-tier via to chips 114, 116, 118. Formation of the redistribution lines 120a, 120b, 120c, may be through any methods known to deposit metal lines (e.g. back-end-of-line processes known to a skilled person).

In various embodiments, the method may further include forming a through silicon via 122 which extends through the substrate 102 and into the dielectric layer 104. The through silicon via 122 may be formed by any known or suitable methods. The method may further include a back grind step. Such a back grind step is to flatten the surface of substrate 102 that is distal to the dielectric layer 104.

Figure 6:
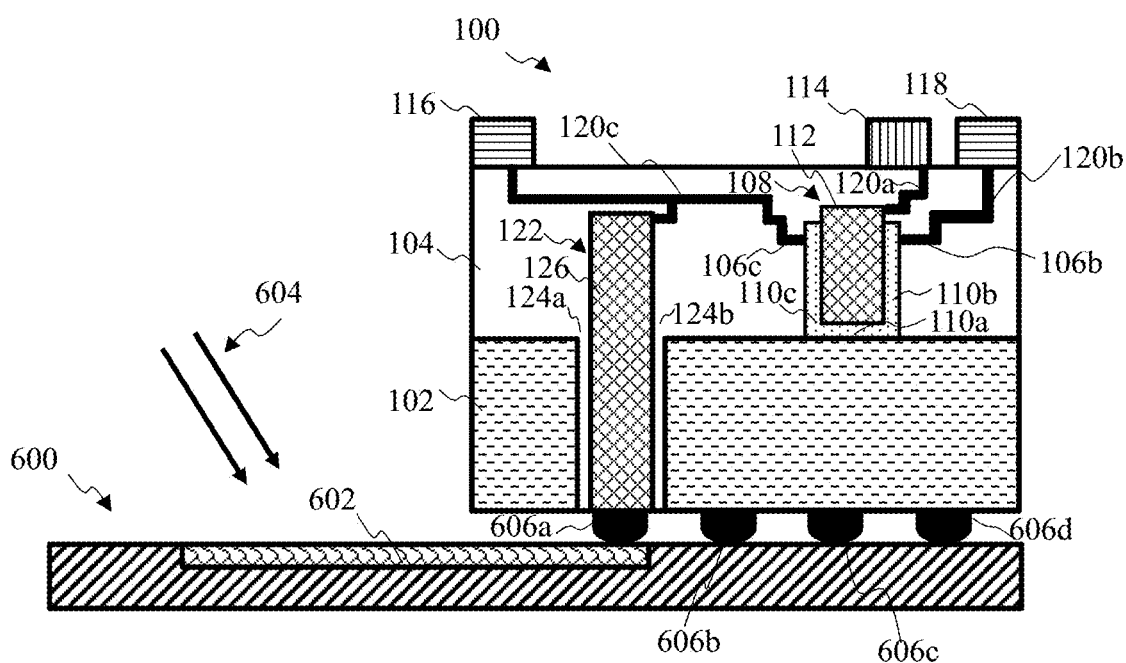
FIG. 6 shows a cross-sectional view of the interposer 100 electrically configured on a sensor platform 600 having a sensor 602.

FIG. 6 shows a non-limiting example of an application of the interposer 100, wherein the interposer 100 is configured on a sensor platform 600 having a sensor 602. Segment of such an application of the interposer 100 includes, but is not limited to, internet of things, bio-sensors, etc. In FIG. 6, the sensor 602 becomes activated by light 604 (e.g. photons). This may create an electrical signal, which may be transmitted to the interposer 100 via one of the contact nodes 606a, 606b, 606c, 606d. The control chip 114 may be operable to have either chip 116, 118 receive the electrical signal or both chips 116, 118 receive the electrical signal. For example, when control chip 114 is operated to have chip 116 receive the signal, the signal then transmits into the interposer 100 via the metal 126 of the through silicon via 122 and via the metal line 120b to reach chip 116. In instances where chip 118 has to receive the signal, the control 114 may be operable to have a voltage applied the resistive layer 110b such that the electrical signal is allowed to be transmitted to chip 118. In various embodiments, the critical dimension of the through silicon via 122 is larger than the critical dimension of via 108. In various embodiments, the interposer 100 may include a passive memory cell. The architecture of the present interposer allows for a complex network metal lines to be formed, i.e. more connectivity may be established from the RRAM structure to even more chips.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. An interposer comprising:
a substrate;
a dielectric layer disposed on the substrate;
a via disposed entirely within the dielectric layer;
a resistive film layer disposed to line the via;
a metal interconnect disposed in the resistive layer lined via; and
a plurality of metal lines disposed in the dielectric layer, the plurality of metal lines including a first metal line connected to the metal interconnect, a second metal line connected to the resistive film layer at a first point, and a third metal line connected to the resistive film layer at a second point.

2. The interposer of claim 1,
wherein the via includes a first end and a second end opposite the first end and sides extending vertically from the first end to the second end,
wherein the resistive film layer lines the sides and the first end of the via, the resistive film layer including a first side portion, a second side portion, and a first end portion, the second side portion opposite the first side portion,
wherein the metal interconnect includes a first end and a second end opposite the first end, the first end of the metal interconnect facing the substrate is entirely surrounded by the resistive film layer and the second end of the metal interconnect is in direct contact with the dielectric layer, and
wherein the first metal line is directly connected to the metal interconnect, the second metal line is directly connected an outer surface of the resistive film layer at the first point, and the third metal line directly connected to the outer surface of the resistive film layer at the second point.

3. The interposer of claim 2, wherein the second end of the metal interconnect extends above the resistive film layer.

4. The interposer of claim 2, wherein the substrate comprises silicon.

5. The interposer of claim 2, wherein the dielectric layer comprises silicon nitride and silicon dioxide with tetraethyl orthosilicate, silicon nitride, thermal oxide, or any low-K dielectric material.

6. The interposer of claim 2, wherein the metal interconnect comprises copper, platinum, ruthenium, or tantalum nitride.

7. The interposer of claim 2, wherein the via is cylindrically shaped and has a diameter of 50 nm to 200 nm.

8. The interposer of claim 2, wherein the resistive film layer comprises hafnium oxide, tantalum oxide, or titanium oxide.

9. The interposer of claim 2, wherein the resistive film layer is a continuous layer.

10. The interposer of claim 2, wherein the first point is opposite the second point.

11. The interposer of claim 2, wherein the first metal line is configured to be electrically connected to a control device.

12. The interposer of claim 11, wherein the second metal line is configured to be electrically connected to a second chip and the third metal line is configured to be electrically connected to a third chip.

13. The interposer of claim 12, wherein the third metal line is configured to be electrically connected to a through silicon via.

14. The interposer of claim 11, wherein the second metal line becomes electrically connected to the metal interconnect when a potential difference between the first metal line and the second metal line exceeds a threshold voltage difference and wherein the third metal line becomes electrically connected to the metal interconnect when a potential difference between the first metal line and the third metal line exceeds the threshold voltage difference.

15. The interposer of claim 11, wherein the first metal line is configured to receive a variable voltage from the control device.

16. The interposer of claim 11, wherein the control device is a controller chip or a PN junction device.

17. The interposer of claim 11, wherein the first metal line is provided in a first metal layer and wherein the second metal line and the third metal line are provided in a second metal layer.

18. The interposer of claim 11, wherein the plurality of metal lines includes a fourth metal line connected to the resistive film layer at a third point.

19. A method of forming an interposer, the method comprising:
forming a dielectric layer disposed on a substrate;
forming a via disposed entirely within the dielectric layer;
forming a resistive film layer disposed to line the via;
forming a metal interconnect disposed in the resistive layer lined via; and forming a plurality of metal lines disposed in the dielectric layer, the plurality of metal lines including a first metal line connected to the metal interconnect, a second metal line connected to the resistive film layer at a first point, and a third metal line connected to the resistive film layer at a second point.

20. The method of claim 19, wherein the via includes a first end and a second end opposite the first end and sides extending vertically from the first end to the second end, wherein the resistive film layer lines the sides and the first end of the via, the resistive film layer including a first side portion, a second side portion, and a first end portion, the second side portion opposite the first side portion, wherein the metal interconnect includes a first end and a second end opposite the first end, the first end of the metal interconnect facing the substrate is entirely surrounded by the resistive film layer and the second end of the metal interconnect is in direct contact with the dielectric layer, and wherein the first metal line is directly connected to the metal interconnect, the second metal line is directly connected an outer surface of the resistive film layer at the first point, and the third metal line directly connected to the outer surface of the resistive film layer at the second point.

* * * * *